United States Patent
Bustamante et al.

(10) Patent No.: US 7,012,563 B1
(45) Date of Patent: Mar. 14, 2006

(54) METHOD AND SYSTEM FOR FREQUENCY DRIFT PREDICTION

(75) Inventors: Sergio Bustamante, Pembroke Pines, FL (US); Maqsud M. Alam, Plantation, FL (US); Mark A. Goldberg, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/937,953

(22) Filed: Sep. 10, 2004

(51) Int. Cl.
  *G01S 5/14* (2006.01)
(52) U.S. Cl. .............................. 342/357.1; 342/357.05; 342/357.12
(58) Field of Classification Search ............. 342/357.1, 342/357.12, 357.05
See application file for complete search history.

(56) References Cited

U.S. PATENT DOCUMENTS

| | | | |
|---|---|---|---|
| 5,742,908 A * | 4/1998 | Dent | 455/517 |
| 5,841,396 A | 11/1998 | Krasner | |
| 6,064,336 A | 5/2000 | Krasner | |
| 6,122,506 A * | 9/2000 | Lau et al. | 455/427 |
| 6,400,314 B1 | 6/2002 | Krasner | |
| 6,424,826 B1 * | 7/2002 | Horton et al. | 455/255 |
| 6,684,158 B1 | 1/2004 | Garin et al. | |
| 6,697,016 B1 | 2/2004 | Voor et al. | |
| 6,741,842 B1 | 5/2004 | Goldberg et al. | |
| 6,867,734 B1 * | 3/2005 | Voor et al. | 342/357.1 |
| 2003/0214432 A1 | 11/2003 | Tawadrous et al. | |
| 2003/0214436 A1 | 11/2003 | Voor et el. | |
| 2005/0162306 A1 * | 7/2005 | Babitch et al | 342/357.05 |

* cited by examiner

*Primary Examiner*—Gregory C. Issing

(57) ABSTRACT

A method (200) of frequency drift prediction for use by a positioning receiver (106) can include the steps of determining (202) a moving average of a frequency error, determining (206) a moving average of a frequency drift rate in a communication device, determining (212) a frequency drift rate uncertainty, and providing (214) the moving average of frequency error and frequency drift rate, and the frequency drift rate uncertainty to the positioning receiver. A point-to-point slope from the running average of the instantaneous frequency error and a running average of the point-to-point slope for a predetermined time period can be determined (208 & 210). The frequency drift uncertainty or window is determined using information determined from the moving average of the frequency drift rate. The positioning receiver can be a global positioning receiver.

18 Claims, 3 Drawing Sheets

METHOD AND SYSTEM FOR FREQUENCY DRIFT PREDICTION

FIELD OF THE INVENTION

This invention relates generally to the field of communications, and more particularly to a method and system for providing an improved frequency drift prediction scheme.

BACKGROUND OF THE INVENTION

Frequency drift as a result of thermal activity in a cell phone essentially affects all Global Positioning System (GPS) enabled cellular phones and their ability to quickly provide a location fix. Accurately predicting frequency drift rate in parts per million per second (ppm/sec) or parts per billion per second (ppb/sec) is difficult in a typical application due to dynamic signal conditions in a real life environment and the different rates of change of temperature experienced by the phone. The thermal factors typically experienced by a phone can be heavily dependent on ambient temperature, phone temperature, phone transmitter power, relative placement of the crystal (XTAL) or temperature corrected crystal oscillator (TCXO) to the heat generating components in the layout, charger activity, phone mode of operation (emergency call, idle, packet data, etc). Typically, an assumption is made by the software in the phone that accounts for the worst possible thermal drift rate. This assumption leads to longer GPS time to first fix (TTFF) times as the frequency search algorithms must be wide enough to account for these worst case conditions.

Several companies discuss the use of Automatic Frequency Control (AFC) from the cell phone system to provide either a one time assist to the GPS engine or a continuous correction. No existing phone tries to predict or estimate frequency drift rate and drift rate uncertainty of the reference oscillator in the phone. As mentioned above, this drift rate will be different depending on the environmental and phone state.

SUMMARY OF THE INVENTION

Embodiments in accordance with the present invention can provide a method by which the uncertainty in both frequency error and frequency drift rate can be narrowed considerably by a simple method of running averages. In this fashion, the phone's AFC (whose variation spreads under bad signal quality conditions in the downlink and improves under better conditions) is used in real-time to determine the frequency error, frequency drift rate and frequency drift rate uncertainty. The algorithm can be used on any cell phone application regardless of the temperature characteristics of the reference oscillator.

In a first embodiment of the present invention, a method of frequency drift prediction for use by a positioning receiver can include the steps of determining estimates for a frequency error, a frequency drift rate, and a frequency drift uncertainty in a communication device based on moving averages and then providing the frequency error, the frequency drift rate and the frequency drift rate uncertainty to the positioning receiver. The step of determining the frequency drift rate can include the step of measuring a running average of a frequency error. Then a point-to-point slope can be calculated from this running average of the frequency error for a predetermined time period. The method can further include the step of determining a moving average of the point-to-point slope in a communication device. The method can further include the steps of determining a frequency drift rate uncertainty window from the difference between maximum and minimum of the drift rate. The positioning receiver can be a global positioning receiver and the step of providing frequency error, drift rate, and drift rate uncertainty can occur when the global positioning receiver is in a weak satellite signal condition. Optionally, the steps of determining the drift rate and the drift rate uncertainty is done using the automatic frequency control of the communication device in real-time. Using the method described above, a time-to-first-fix can be accelerated for the positioning receiver at weak satellite signal levels where dwell times are typically elongated and the wide frequency search windows degrade TTFF considerably.

In a second embodiment of the present invention, another method for generating a frequency reference in a hybrid communications device can include the steps of generating a clock signal at a base frequency, performing communications processing in a communications receiver based on an input of the clock signal at the base frequency; and generating frequency tracking data containing frequency error, frequency drift rate and a frequency drift rate uncertainty of the communications receiver. The method can further include the steps of performing positioning processing in a positioning receiver based on an input of the clock signal at the base frequency and transmitting a control message to the positioning receiver to adapt positioning processing based on the frequency tracking data. The frequency tracking data can include an automatic frequency control message.

In a third embodiment of the present invention, a system for generating a frequency reference in a hybrid communications device, can include a clock source generating a clock signal at a base frequency and a communications receiver that performs communications processing based on an input of the clock signal at the base frequency and generates frequency tracking data containing an offset frequency (or frequency error), a frequency drift rate, and a frequency drift rate uncertainty. The system can further include a positioning receiver that performs positioning processing based on an input of the clock signal at the base frequency and a processor that communicates with the communications receiver and the positioning receiver and transmits a control message to the positioning receiver to adapt positioning processing based on the frequency tracking data. The communications receiver can be a cellular telephone, a personal digital assistant, a messaging device, a two-way pager, a radio receiving device, a modem, a network-enabled wireless device, a radio receiving device, a transceiver, a wireless modem, a wired modem or an optical-receiver. The positioning receiver can be a GPS receiver. The frequency tracking data can be an automatic frequency control (AFC) message which can contain frequency deviation data generated by comparison to a base station signal.

Other embodiments, when configured in accordance with the inventive arrangements disclosed herein, can include a system for performing the methods disclosed herein and a machine readable storage for causing a machine to perform the various processes and methods disclosed herein.

DETAILED DESCRIPTION OF THE DRAWINGS

Figure 1:
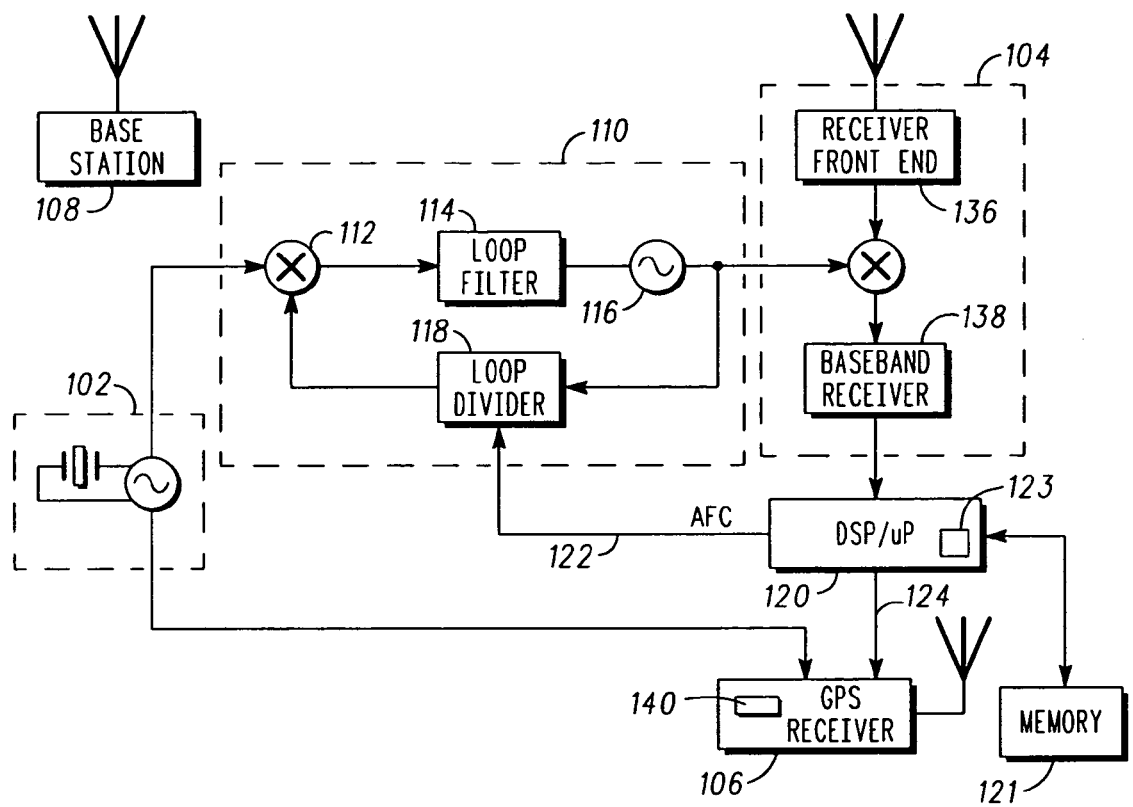
FIG. 1 is a block diagram of a system for frequency drift prediction in a mobile radio in accordance with an embodiment of the present invention.

While the specification concludes with claims defining the features of embodiments of the invention that are regarded as novel, it is believed that the invention will be better understood from a consideration of the following description in conjunction with the figures, in which like reference numerals are carried forward.

Embodiments in accordance with the present invention can provide a method by which the uncertainty in both frequency error and frequency drift rate can be narrowed considerably by a simple method of running averages. In this fashion, the phone's AFC (whose variation spreads under bad signal quality conditions in the downlink and improves under better conditions) can be used in real time to determine drift rate and drift rate uncertainty.

An architecture or system 100 in which a frequency management system according to the invention may be implemented is illustrated in FIG. 1, in which a combined communications/positioning device incorporates both GPS receiver circuitry 106 and a communications transceiver 104. As illustrated, the communications transceiver 104 may include a receiver front end 136 for detection and downconversion of communications carrier signals, such as cellular telephone or other radio frequency (RF) or other signals, as well as a baseband receiver 138 for processing downconverted communications signals. The communications transceiver 104 of the combined device may be or include for instance a portable radio, cellular telephone, two-way or other pager, wireless modem, wireless personal digital assistant or other device that receives or transmits a radio, optical or other wireless communications signal. In embodiments, the communications transceiver 104 may communicate with or receive signals from a base station 108, such as a cellular base station, or other communications facility or site.

The combined communications/positioning device as illustrated may contain a base oscillator 102 to provide a frequency reference to ultimately drive the communications transceiver 104 as well as the GPS receiver circuitry 106. In embodiments base oscillator 102 may be a free-running, uncompensated reference part. The base frequency of the base oscillator 102 may be set to values compatible with cellular or other operation at 800/900 MHz, 1900 MHz or other frequency ranges. The base oscillator 102 may for example be set to 16.8 MHz or other frequencies which may be multiplied to carrier ranges. An uncompensated crystal oscillator used to implement base oscillator 102 may by itself typically exhibit, for instance, a frequency deviation of ±3 ppm or more or less. In other implementations, the base oscillator 102 can be or can include a TCXO or other compensated part achieving tighter or better frequency tolerance.

The base oscillator 102 as illustrated can deliver a frequency reference to a first phase locked loop 110 to drive operating frequencies for cellular or other communications or other operations. The first phase locked loop 110 can include a phase comparator 112, to compare the phase of the base oscillator 102 with the phase of a high-frequency oscillator 116. High-frequency oscillator 116 can for instance be implemented as a voltage controlled high-frequency oscillator (VCO) generating frequencies, for instance, in the 800/900 MHz, 1900 MHz or other ranges for cellular or other operation. A loop filter 114 may low-pass filter the output of the phase comparator 112 to remove higher frequency artifacts or other noise, and stabilize the phase locked loop 110.

The output of the loop filter 114 may in turn drive the high-frequency oscillator 116 to operating frequencies, which through the return provided by loop divider 118 completes a closed feedback loop to phase comparator 112. The phase of the high-frequency oscillator 116 is thereby locked to the phase of the base oscillator 102, so that the phase angle between them remains zero or approximately zero, or at a fixed or approximately fixed separation during operation.

The clock reference of the high-frequency oscillator 116 forms an output of the first phase locked loop 110, which can in turn drive communications transceiver 104 to demodulate, downconvert and receive the wireless signals broadcast to the communications device, or perform other communications operations. According to one embodiment, the frequency reference of high-frequency oscillator 116 can be programmed or scaled according to operating needs, such as for instance for multi-band operation for cellular handsets, or other implementations.

The communications transceiver 104 may acquire and lock to base station 108, such as a cellular base station, or other communications sites or networks. Once registered to base station 108, the communications transceiver 104 can measure the degree of frequency offset (or frequency error) between the output of the first phase locked loop 110 driving the communications transceiver 104, and the base station 108. The frequency offset may be tracked to a fairly high accuracy, for instance ±0.1 ppm or more or less, in part because cellular or other base stations 108 may maintain accurate cesium or other clock references which may be broadcast over their communications channels. In accordance with one embodiment, frequency error, drift rate, and a drift rate uncertainty estimates can be determined. In this regard, a running average of an instantaneous frequency error can be calculated and a point-to-point slope can be determined from the running average of the instantaneous frequency error to provide an instantaneous drift rate. Thus, for a predetermined time period (most likely determined or based on the transmission slot scheme used by a particular communication system), a running average of the point-to-point slope of frequency error can be determined as the estimate of drift rate. Furthermore, a drift rate uncertainty is determined from the drift rate as the difference between maximum and minimum from a predetermined time period.

Once the frequency offset is determined according to embodiments of the invention, a DSP or processor 120 can communicate a digital frequency tracking message 122 to loop divider 118 or other element of first phase locked loop 110. That digital frequency tracking message 122, such as an AFC word or other message or data, can permit the fine tuning of the loop divide ratio or other parameters to cause the output of first phase locked loop 110 to track the frequency of base station 108 in frequency over time. Processor 120 can be or can include, for instance, a general purpose programmable processor such as a processor among the Motorola ColdFire™. family of processors or others, or a digital signal processor such as a processor among the Motorola 56000™. family of DSPs, or other logical elements or processors.

Once the frequency error, drift rate, and drift rate uncertainty estimates are determined according to embodiments of the invention, the DSP or processor 120 can also communicate a message 124 representative of these parameters to the GPS receiver circuitry 106. A message generator 123 in this regard can be used to generate the messages 122 and 124 in the appropriate format for each receiver circuit. Also note, a memory 121 can be used to assist in determining the frequency error, frequency drift rate, and frequency drift rate uncertainty if needed although the processor 120 itself may contain sufficient memory to handle such tasks. The GPS receiver circuitry 106 itself can in general operate based on a clock signal derived from base oscillator 102. The GPS receiver circuitry 106 can initiate acquisition of Gold codes or other GPS or positioning signals based on that clock. According to the embodiment illustrated in FIG. 1, therefore, a frequency reference from base oscillator 102 can be communicated to the GPS receiver circuitry 106 in parallel with the communications or other circuitry, without requiring a local oscillator in the GPS receiver circuitry 106 itself.

After the communications transceiver 104 of the combined communications/positioning device along with processor 120 have tracked frequency deviation in the communications portion based on base station 108, processor 120 can likewise communicate the message 124 to the GPS receiver 106. Since the detected frequency deviation in communications transceiver 104 derives from first phase locked loop 110 locked to base oscillator 102, the same information may be usefully employed to adjust the operation of GPS receiver 106. For example, in several embodiments, the GPS receiver 106 may adjust the Doppler center frequency, or the width of the Doppler search message, or other Doppler or other parameters based on message 124 (containing frequency error, drift rate, and drift rate uncertainty information). In embodiments, for instance, knowledge of frequency deviation in base oscillator 102 may permit the Doppler search window, or frequency bands around center through which searching is done to detect Gold code or other signals, to be narrowed. Frequency drift rate and drift rate uncertainty estimates can provide further refinements. A narrower Doppler search window may require less time to scan and process for those signals, resulting in faster time to first fix, detection of weaker GPS signals, or improve other performance characteristics.

The GPS receiver circuitry 106 may consequently acquire and track GPS signals without the added costs and complexity of incorporating an additional local oscillator or other signal processing circuitry or software to enhance the frequency reference for that portion of the combined device.

The output of base oscillator 102 can be communicated directly to the GPS receiver circuitry as shown, omitting any intervening frequency synthesizer module, if that generation is not needed for operation in given implementations. In such embodiments, the GPS receiver circuitry 106 may itself contain, for instance, an integral synthesizer 140 or other frequency generation module, to derive the necessary 1.575 GHz or other upconvert frequency for GPS or other positioning operation. The message 124 to GPS receiver 106 can be used for dynamic adjustment of Doppler search parameters such as Doppler search window width, frequency drift velocity, frequency error predictive estimates, or other control parameters.

In accordance with embodiments of the present invention, a frequency error, drift rate and drift rate uncertainty prediction algorithm was developed based on the measured history of a running average of cumulative frequency offset when a mobile locks to a base station. Such algorithm can assist in reducing the Time-To-First-Fix (TTFF) at a signal level down to a predetermined GPS receiver sensitivity level in dBHz. In this regard, note that the drift rate can be calculated as follows:

$$DR=(df/dT)\times(dT/dt)$$

Where df/dT is the instantaneous slope of the reference frequency with respect to temperature in ppb/DegC, and dT/dt is the instantaneous temperature slope at the XTAL with respect to time in DegC/sec.

df/dT is the XTAL/TCXO parameter which is controlled by the crystal or temperature controlled oscillator vendor.

dT/dt is a product parameter which depends on various parameters such as the operating temperature, PA temperature profile, transmitter output power, battery charging current, relative placement of the XTAL/TCXO compared to heat generating components, printed circuit board (PCB) layout, or other heat generating components.

Figure 2:
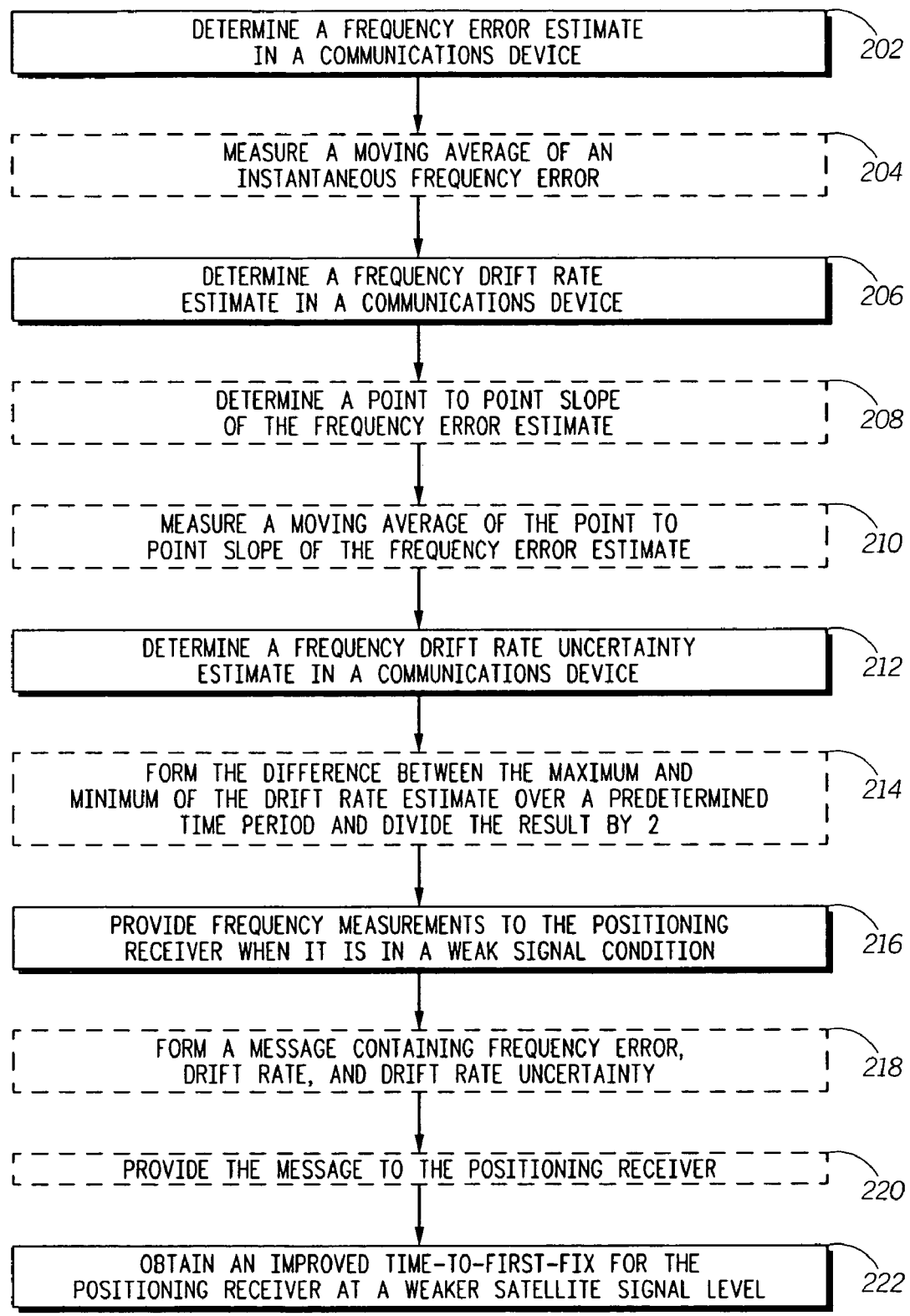
FIG. 2 is a flow chart illustrating a method of frequency drift prediction for use by a positioning receiver in accordance with an embodiment of the present invention.

Referring to FIG. 2, a flow chart of a method 200 of frequency drift prediction for use by a positioning receiver is shown. The method 200 can include the steps of determining estimates for a frequency error at step 202, a frequency drift rate at step 206, and a frequency drift uncertainty at step 212 in a communication device based on the moving averages and then providing the frequency error, the frequency drift rate and the frequency drift rate uncertainty estimates to the positioning receiver at step 216. The step 202 of determining the frequency error can include the step 204 of measuring a running average of an instantaneous frequency error over a predetermined sample size (for example, 70 points or samples). The step of determining the frequency drift rate 206 can include the step 208 of determining a point-to-point slope from the frequency error. The step of determining the frequency drift rate estimate can further include step 210 of measuring the moving average of the point-to-point slope of frequency error. As noted with regard to step 212, the method can include the step 214 of determining a frequency drift rate uncertainty estimate or window from the difference between a maximum and a minimum of the drift rate moving average over a predetermined time period. The positioning receiver can be a global positioning receiver and the step of providing frequency error, drift rate, and drift rate uncertainty can occur when the global positioning receiver is in a weak satellite signal condition as noted at step 216. The step of providing a frequency error, drift rate, and drift rate uncertainty can further include step 218 of forming a control message containing these measurements and step 220 of transmitting the message to the positioning receiver. Using the method described above, a time-to-first-fix (TTFF) can be obtained at weak satellite signal levels at step 222 (even at positioning receiver signal levels as low as 15 dBHz or less). TTFF can also be accelerated for the positioning receiver where dwell times are typically elongated and the wide frequency search windows degrade TTFF considerably.

Figure 3:
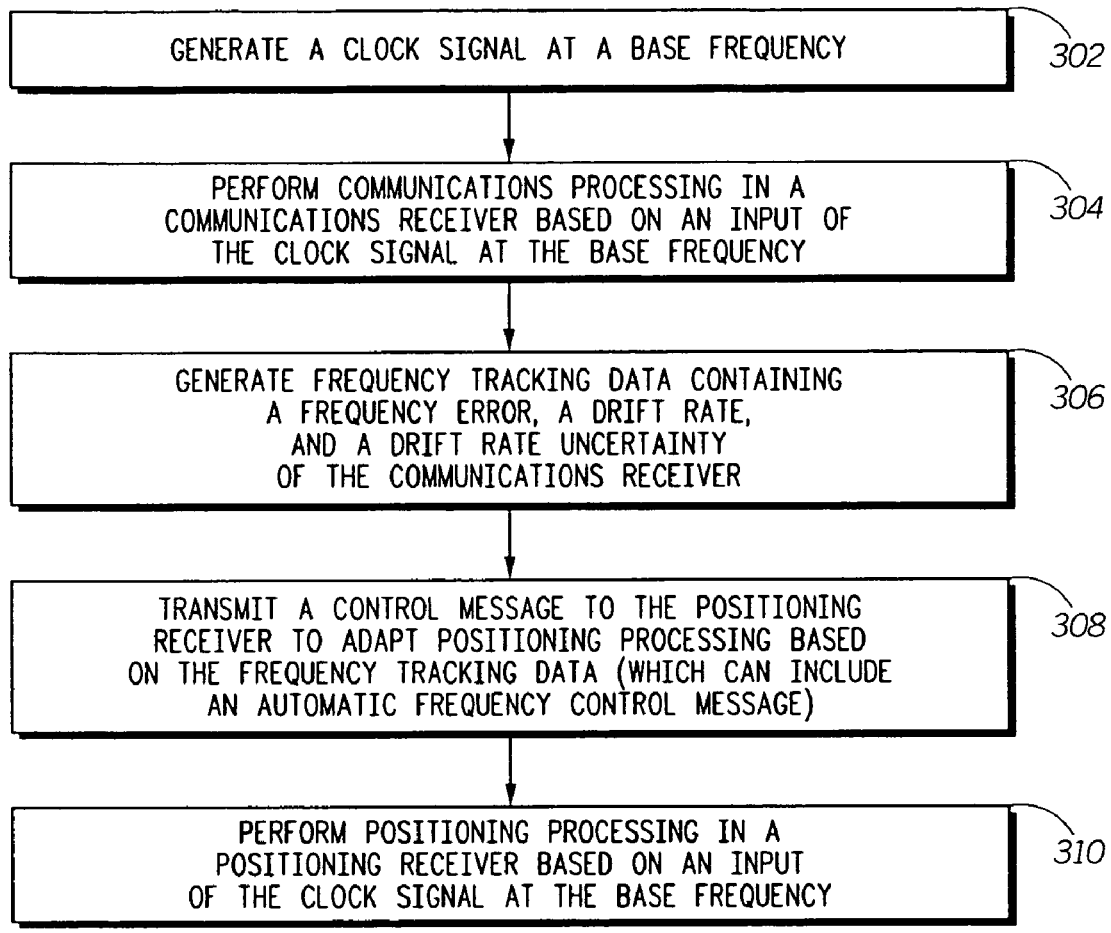
FIG. 3 is a flow chart illustrating another method of generating a frequency reference in a hybrid communications device in accordance with an embodiment of the present invention

Referring to FIG. 3, another flow chart illustrating a method 300 for generating a frequency reference in a hybrid communications device is shown. The method 300 can include the step 302 of generating a clock signal at a base frequency, performing communications processing in a communications receiver based on an input of the clock signal at the base frequency at step 304; and generating frequency tracking data containing frequency error, frequency drift rate and a frequency drift rate uncertainty of the communications receiver at step 306. The method 300 can further include the step 308 of transmitting a control message to the positioning receiver to adapt positioning processing based on the frequency tracking data and the step 310 of performing positioning processing in a positioning receiver based on an input of the clock signal at the base frequency. Note, the frequency tracking data can include an automatic frequency control message.

In one practical example using Motorola's iDEN radio technology, note that iDEN's slot-to-slot DSP frequency measurement error while locked to a base station signal has a current uncertainty specification of +/−0.5 ppm relative to a GPS satellite clock due to various factors like Doppler effect, base station reference frequency accuracy, Received Signal Strength (RSS), and Carrier to Noise+Interference power ratio (C/(I+N)). This uncertainty specification also includes the assumption that the frequency drift due to temperature effects on the XTAL/TCXO circuit is such that it will not drift faster than about 5 ppb/sec in the time it takes to obtain a fix at low satellite signal levels. This imposes serious constraints on the layout placement and temperature drift specifications on reference oscillators that make the part expensive and impractical in cell phone designs, especially as form factors get smaller. If the frequency measurement uncertainty specification can be reduced and if the drift rate and drift rate uncertainty can be estimated in real time, then the GPS receiver 106 can be aided with these parameters to predict and track the actual reference frequency as measurement dwell times grow with weak satellite signals. A characterization of frequency uncertainty was performed on radios at controlled temperatures in order to study the possibility of minimizing the current frequency measurement uncertainty specification.

First, baseline measurements of frequency offset were performed using a high stability signal generator to provide an accurate reference frequency 102 while a DSP (120) operated with the AFC in open loop mode (frequency offset is measured but not corrected/tracked). Measurements were first taken for varying cellular signal RSS levels. Statistical distributions of frequency offset error were plotted at the various RSS levels to determine the DSP AFC variation as a function of signal strength. It was determined that in a strong signal environment free of interference, the distribution of the AFC error measured by the DSP achieves the system level requirement of +/−0.5 ppm. Measurements under these conditions were below +/−0.015 ppm down to receive signal levels of −100 dBm for the iDEN receiver at a receive frequency of 851 MHz.

Next, the signal generator was replaced by a low cost TCXO to provide a more realistic reference frequency and measurements were re-taken with the AFC still in open loop mode. The radio under test was soaked for ½ an hour in a temperature-controlled environment to stabilize the TCXO frequency. All offsets were calibrated to provide a zero frequency error at the stabilized temperature. New measurements were taken while the radio was set to receive with AFC in open loop mode. This measurement process was repeated at room and extreme temperatures. These measurements can provide a distribution of the frequency error in parts-per-billion (ppb) when a stable reference 102 is used. Measurement errors under these conditions were below +/−0.04 ppm down to receive cellular signal levels of −100 dBm for the iDEN receiver. The increase in the spread, compared to the baseline spread of +/−0.015 ppm obtained using a high stability signal generator reference, is attributed to reference oscillator imperfections resulting in degraded phase noise, jitter, and temperature compensation.

As a next step in the frequency uncertainty characterization, an interference condition was set up by supplying the radio with an external interferer such as Co-Channel, Adjacent Channel, and Blocker interference types. Further, a set of channel fading profiles were used to test frequency error performance in a multipath environment. Industry standard profiles consisting of Static, BUS, BU50, and BU100 channels were tested with desired and interfering signals independently faded. Various levels of cellular signal carrier to interferer power ratios were tested to simulate real world conditions. All offsets were calibrated to provide a zero frequency error at the stabilized temperature. The results of this test revealed that the 99% spread in frequency error remained below +/−0.24 ppm even under extreme Co-Channel interference conditions of C/I=15 dB. It is worth noting that in a real system, such an extreme level of degradation is uncommon, as handovers to better quality serving cells would normally occur long before conditions are permitted to degrade to this extent. Since Co-channel Interference was found to have the worst-case effect, further characterization focused on the use of this type cellular signal interferer. From the above result, it was concluded that the present uncertainty of +/− 0.5 ppm can be reduced to about +/−0.25 ppm as long as a good predictor for drift rate (direction) and drift rate uncertainty (spread) can be estimated.

As a final step of frequency uncertainty characterization, the closed-loop AFC tracking characteristics were measured. In this measurement a high stability signal generator was once again used to provide an accurate reference frequency. To measure tracking performance the generator was frequency modulated with a ramp waveform. All measurements in this analysis were performed while the AFC loop was closed (frequency measured and tracked/corrected). At the start of the characterization runs, all offsets were calibrated to provide a zero frequency error at the stabilized temperature. The reference modulating ramp was set up to simulate the effects of heating, due to full power cellular transmissions, on a reference circuit such as a XTAL or TCXO. An extreme case of +/−30 ppb/sec ramp was used in the measurements. The iDEN DSP (120) AFC loops were turned on to allow tracking of the changing reference. The algorithm proposed in this embodiment calculates frequency error, frequency drift rate, and drift rate uncertainty. A 70-point moving average was used to calculate all three parameters. The frequency error was found to track the actual frequency ramp applied to within the accuracy of our measurement. Drift rate was found to track the actual frequency drift rate of the applied reference signal to within +/−3 ppb/sec of the applied ramp of 30 ppb/sec (within 10%) proving that the algorithm is a good predictor of drift rate. The tracking capability improves as cellular signal conditions improve in low interference and low fading environments. Drift rate uncertainty was also calculated and found to be within +/−3 ppb/sec except in the extreme BU100 case where it was slightly over 5 ppb/sec proving that the algorithm is a good predictor of drift rate uncertainty. Similar to drift rate, drift rate uncertainty improves with better cellular signal conditions.

Observations from the characterization described above indicated that taking more points for the moving average of the frequency error and drift rate improves the accuracy of the drift rate and drift rate uncertainty estimates. Also, the frequency drift rate and the frequency drift rate uncertainty can be predicted based on a history of the moving average of the cumulative frequency error calculation. Further note that the approximation becomes better when the number of points needed to calculate the moving average of the frequency error and slope is increased. This is done at the expense of an increased wait time in the GPS session. In a typical iDEN call session, a wait time of 70×45 ms=3.15 seconds (after a call is initiated) is needed to start providing drift rate and drift rate uncertainty parameters to the GPS receiver 106. The characterization results and analysis prove the ability of the present algorithm to predict frequency error, drift rate and drift rate uncertainty under adverse cellular signal conditions with sufficient accuracy to tighten the current frequency uncertainty specification. From this experiment, the present frequency uncertainty specification of ±0.5 ppm used to aid the GPS receiver 106 can be lowered to under +/−0.25 ppm even under adverse cellular signal conditions. In addition, real time direction of drift as well as drift rate uncertainty can be provided to the GPS receiver to allow improved frequency tracking without increasing the size of the frequency uncertainty widow to account for unknown drift.

Once again, a step-by-step description is provided as to how a hybrid communication device (such as a combined cellular phone and GPS receiver) in accordance with an embodiment of the invention can use an algorithm to provide a GPS receiver with frequency error, drift rate, and drift rate uncertainty parameters. First, a running average of the instantaneous frequency error measured by a DSP or other processor is kept by the processor (or in a lower level layer of a software system in a radio such as an iDEN phone). This running average is to be kept for predetermined number (X) of slots (slots are measured every 45 ms in an iDEN call). Second, the running average can be used for a point-to-point slope calculation. Third, a running average of the point-to-point slope is kept for X slots. This third step provides the GPS receiver with the parameter for drift rate. In a fourth step, a maximum and minimum delta from the last X points in the third step is calculated and divided by two. The divide by two provides the GPS receiver with the drift rate uncertainty as a +/−parameter. The processing of the data described above can be done for example in an iDEN modem or in software within the hybrid communication device. Parameters for frequency error, drift rate, and drift rate uncertainty can be passed to the GPS software (within the positioning receiver) via messages between processors. The GPS receiver can use the information to narrow the frequency search, predict frequency trend, and improve time to first fix.

In light of the foregoing description, it should be recognized that embodiments in accordance with the present invention can be realized in hardware, software, or a combination of hardware and software. A network or system according to the present invention can be realized in a centralized fashion in one computer system or processor, or in a distributed fashion where different elements are spread across several interconnected computer systems or processors (such as a microprocessor and a DSP). Any kind of computer system, or other apparatus adapted for carrying out the functions described herein, is suited. A typical combination of hardware and software could be a general purpose computer system with a computer program that, when being loaded and executed, controls the computer system such that it carries out the functions described herein.

In light of the foregoing description, it should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A method of frequency drift prediction for use by a positioning receiver, comprising the steps of:
   determining a moving average of a frequency error in a communication device;
   determining a moving average of a frequency drift rate of the communication device;
   determining a frequency drift rate uncertainty in a communication device; and
   providing the moving average of the frequency error, the moving average of the frequency drift rate, and the frequency drift rate uncertainty to the positioning receiver.

2. The method of claim 1, wherein the step of determining the moving average of the frequency error comprises determining a moving average of a cumulative frequency error by measuring a running average of real-time frequency error.

3. The method of claim 2, wherein the method further comprises the step of determining a point-to-point slope from the moving average of the cumulative frequency error.

4. The method of claim 3, wherein the method further comprises the step of determining a running average of the point-to-point slope for a predetermined time period.

5. The method of claim 4, wherein the method further comprises the step of determining a drift rate uncertainty from the difference between a maximum and a minimum from the predetermined period as a +/−parameter.

6. The method of claim 1, wherein the method further comprises the step of determining a moving average of cumulative frequency error of the communication device.

7. The method of claim 1, wherein the positioning receiver is a global positioning receiver and the step of providing the moving average of the frequency error, the moving average of the frequency drift rate, and the frequency drift rate uncertainty occurs when the global positioning receiver is in a weak satellite signal condition.

8. The method of claim 1, wherein the steps of determining the moving average of a frequency drift rate and the frequency drift rate uncertainty is done using the automatic frequency control of the communication device in real time.

9. The method of claim 1, wherein the method further comprises the step of obtaining a faster time-to-first-fix for the positioning receiver at low satellite signal level.

10. A method for generating a frequency reference in a hybrid communications device, comprising the steps of:
    generating a clock signal at a base frequency;
    performing communications processing in a communications receiver based on an input of the clock signal at the base frequency;
    generating frequency tracking data containing a moving average of a frequency error, frequency drift rate and a drift rate uncertainty of the communications receiver;
    transmitting a control message to the positioning receiver to adapt positioning processing based on the frequency tracking data; and
    performing positioning processing in a positioning receiver based on an input of the clock signal at the base frequency.

11. A method according to claim 10, wherein the frequency tracking data comprises an automatic frequency control message.

12. A system for generating a frequency reference in a hybrid communications device, comprising:
    a clock source generating a clock signal at a base frequency;
    a communications receiver, the communications receiver performing communications processing based on an input of the clock signal at the base frequency, the communications receiver generating frequency tracking data containing a moving average of frequency error, a frequency drift rate and a drift rate uncertainty;

a positioning receiver, the positioning receiver performing positioning processing based on an input of the clock signal at the base frequency; and a processor, the processor transmitting a control message to the positioning receiver to adapt positioning processing based on the frequency tracking data, the processor communicating with the communications receiver and the positioning receiver.

13. A system according to claim 12, wherein the communications receiver comprises at least one of a cellular telephone, a personal digital assistant, a two-way pager, a radio receiving device, a modem, and a network-enabled wireless device.

14. A system according to claim 12, wherein the communications receiver comprises at least one of a radio receiving device, transceiver, a wireless modem, a wired modem and an optical-receiver.

15. A system according to claim 12, wherein the positioning receiver comprises a Global Positioning System receiver.

16. A system according to claim 12, wherein the frequency tracking data comprises an automatic frequency control message.

17. A system according to claim 16, wherein the automatic frequency control message comprises frequency deviation data generated by comparison to a base station signal.

18. The system according to claim 12, wherein the processor is further programmed to determine a moving average of the cumulative frequency error, a moving average of a drift rate, and a drift rate uncertainty of the communication receiver, and provide the moving average of the cumulative frequency error, moving average of the drift rate, and the drift rate uncertainty to the positioning receiver.

* * * * *